US011320460B2

(12) United States Patent
Nah

(10) Patent No.: US 11,320,460 B2
(45) Date of Patent: May 3, 2022

(54) PROBE DEVICE OF FLOATING STRUCTURE

(71) Applicant: Phoenixon Controls Inc., Hwaseong-si (KR)

(72) Inventor: Ki Sool Nah, Hwaseong-si (KR)

(73) Assignee: Phoenixon Controls Inc., Hwaseong-si (KR)

( * ) Notice: Subject to any disclaimer, the term of this patent is extended or adjusted under 35 U.S.C. 154(b) by 126 days.

(21) Appl. No.: 16/790,657

(22) Filed: Feb. 13, 2020

(65) Prior Publication Data

US 2020/0264211 A1    Aug. 20, 2020

(30) Foreign Application Priority Data

Feb. 15, 2019    (KR) .................. 10-2019-0017522

(51) Int. Cl.
*G01R 1/067*    (2006.01)
*G01R 1/073*    (2006.01)
*G01R 3/00*    (2006.01)

(52) U.S. Cl.
CPC ..... *G01R 1/06738* (2013.01); *G01R 1/07371* (2013.01); *G01R 3/00* (2013.01)

(58) Field of Classification Search
CPC ... G01R 1/06738; G01R 1/07371; G01R 3/00
See application file for complete search history.

(56) References Cited

U.S. PATENT DOCUMENTS

| 4,926,119 | A | * | 5/1990 | Prokopp | G01R 1/06738 |
| | | | | | 324/754.14 |
| 5,124,646 | A | * | 6/1992 | Shiraishi | G01R 1/07392 |
| | | | | | 324/756.03 |
| 7,116,123 | B2 | * | 10/2006 | Goto | G01R 1/06722 |
| | | | | | 324/755.05 |
| 7,507,110 | B1 | | 3/2009 | Yin et al. | |
| 8,269,516 | B1 | | 9/2012 | Mardi et al. | |
| 2002/0197891 | A1 | | 12/2002 | Suematsu | |
| 2006/0103405 | A1 | | 5/2006 | Parker et al. | |
| 2009/0079450 | A1 | * | 3/2009 | Hartmann | G11C 29/56016 |
| | | | | | 324/755.05 |
| 2011/0117796 | A1 | | 5/2011 | Oishi | |
| 2013/0203300 | A1 | * | 8/2013 | Mori | G01R 31/2601 |
| | | | | | 439/786 |
| 2018/0335447 | A1 | | 11/2018 | Yamamoto | |

FOREIGN PATENT DOCUMENTS

| JP | 54-149881 U | 10/1979 |
| JP | 2010-014544 A | 1/2010 |
| JP | 2014-032111 A | 2/2014 |
| KR | 10-1334458 B1 | 11/2013 |
| KR | 10-2018-0052210 A | 5/2018 |

* cited by examiner

*Primary Examiner* — Paresh Patel
(74) *Attorney, Agent, or Firm* — Revolution IP, PLLC

(57) ABSTRACT

Disclosed is a probe device of a floating structure including a probe unit having a groove formed at one end thereof into which a needle for transmitting an electrical signal is inserted, and a guide portion formed at the other end thereof and a plate unit having an inner space which is inserted with the guide portion and formed to support a part of the guide portion, wherein the guide portion is spaced apart from the inner space at a predetermined interval by an external force applied to the needle.

3 Claims, 7 Drawing Sheets

【Figure 1】
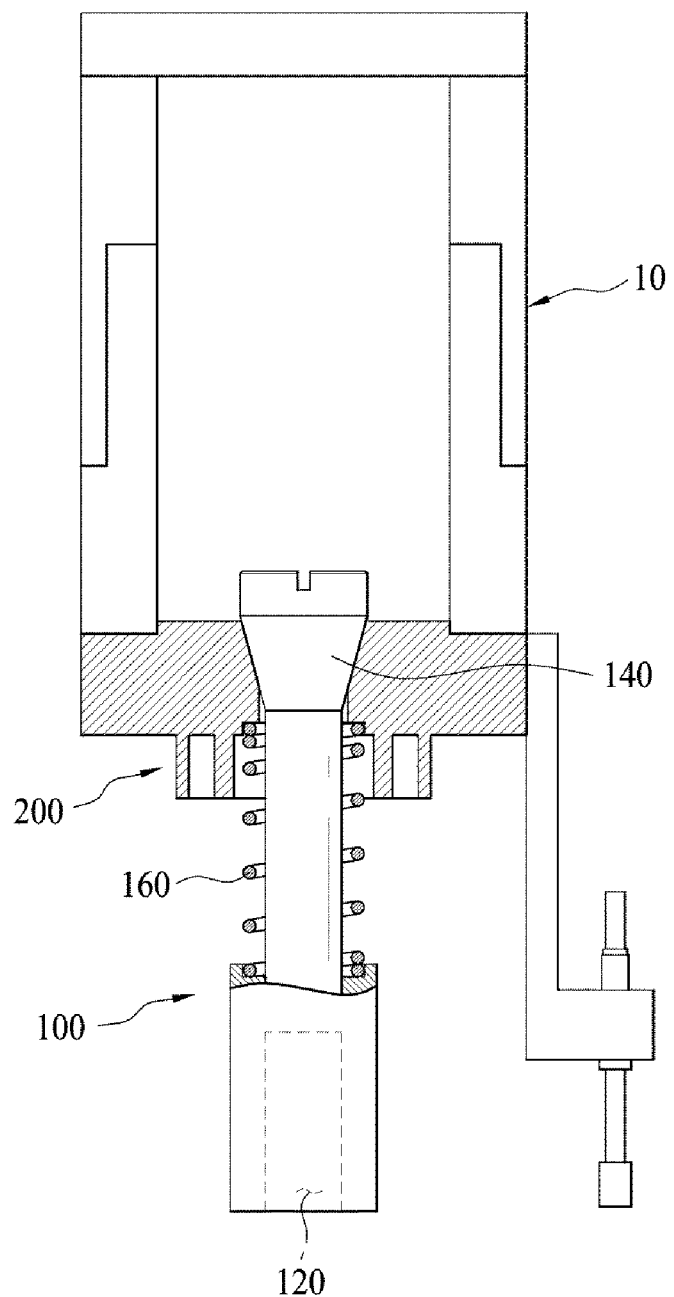

[Figure 2]
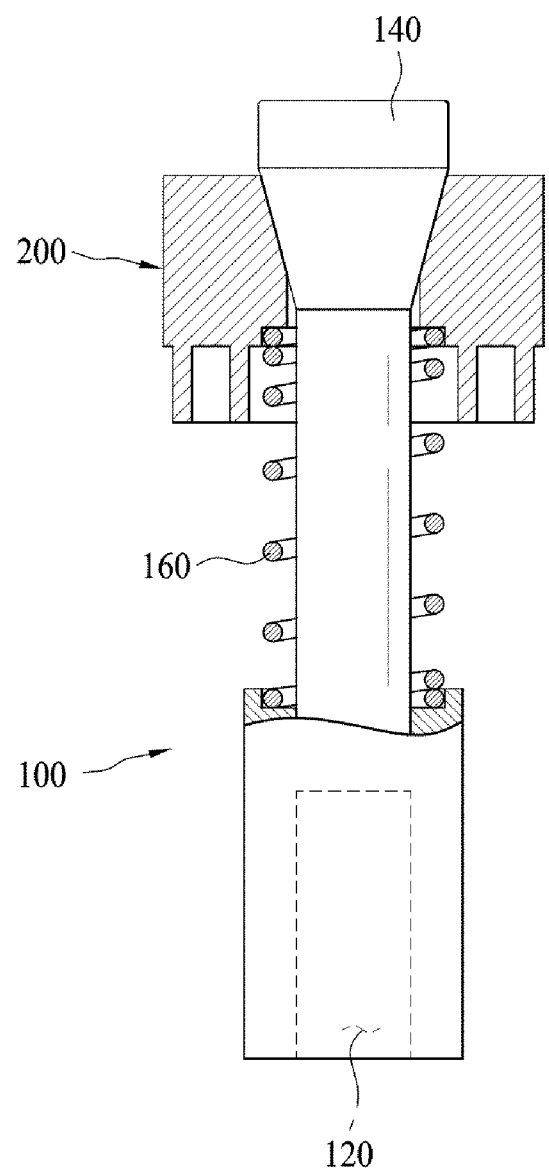

【Figure 3】
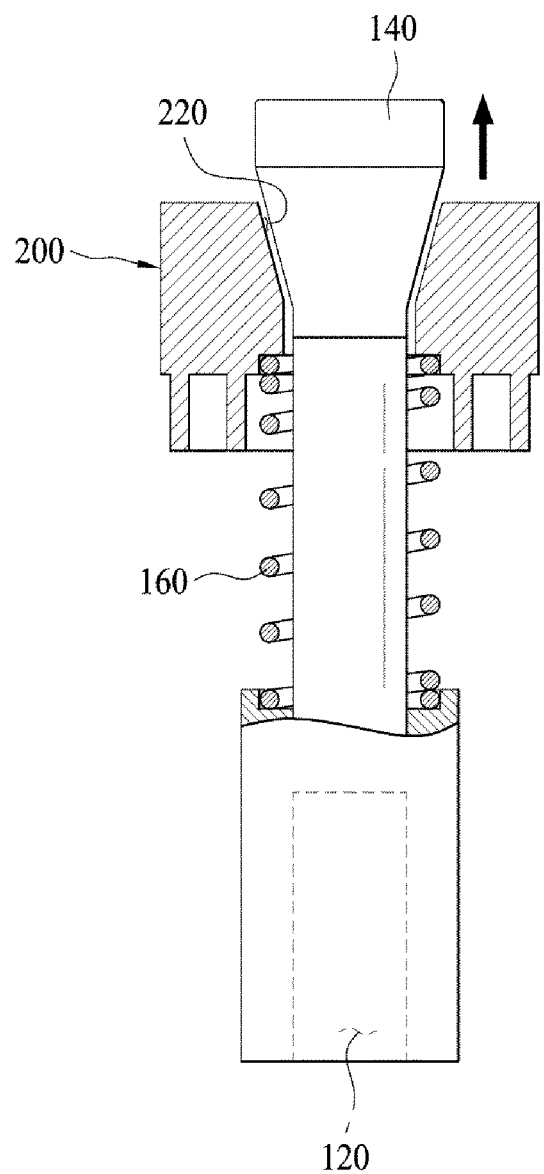

[Figure 4]
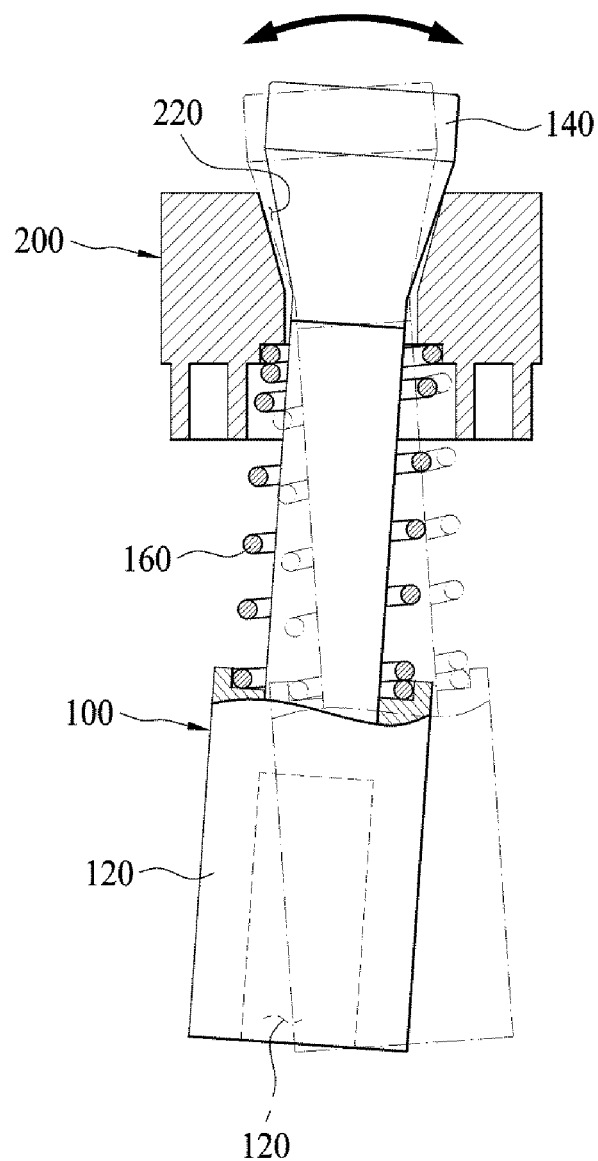

【Figure 5】
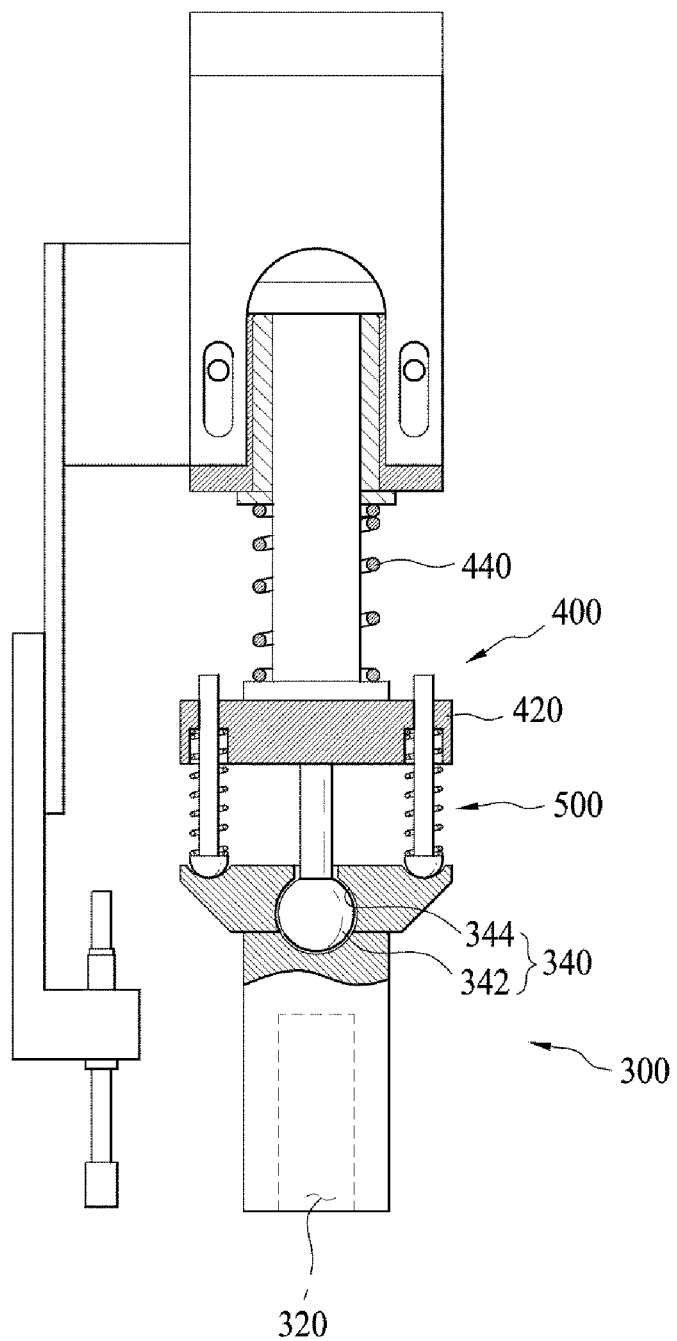

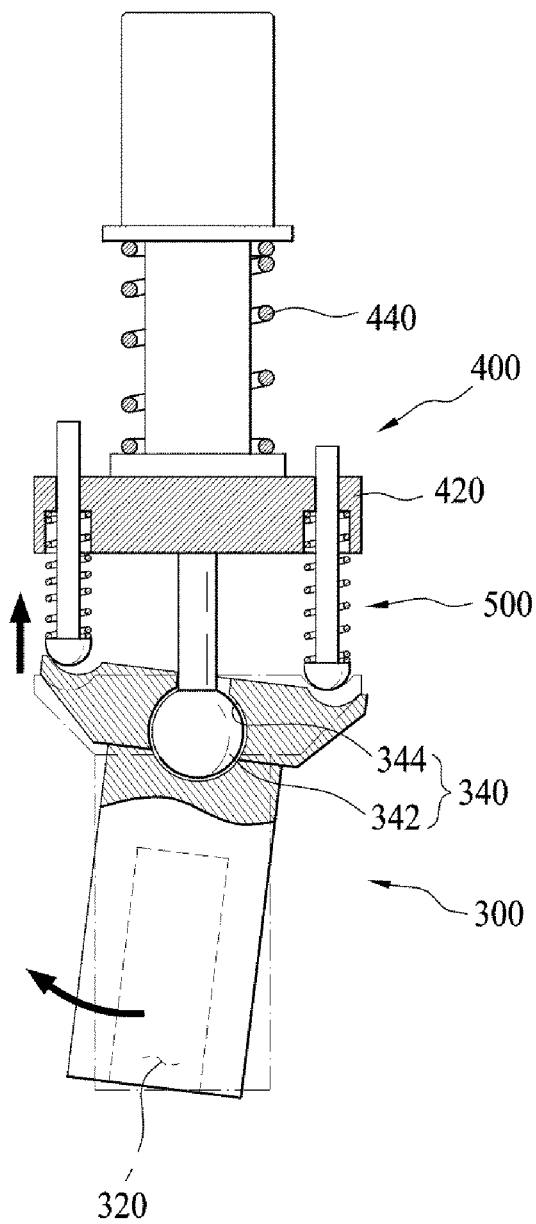
[Figure 6]

[Figure 7]
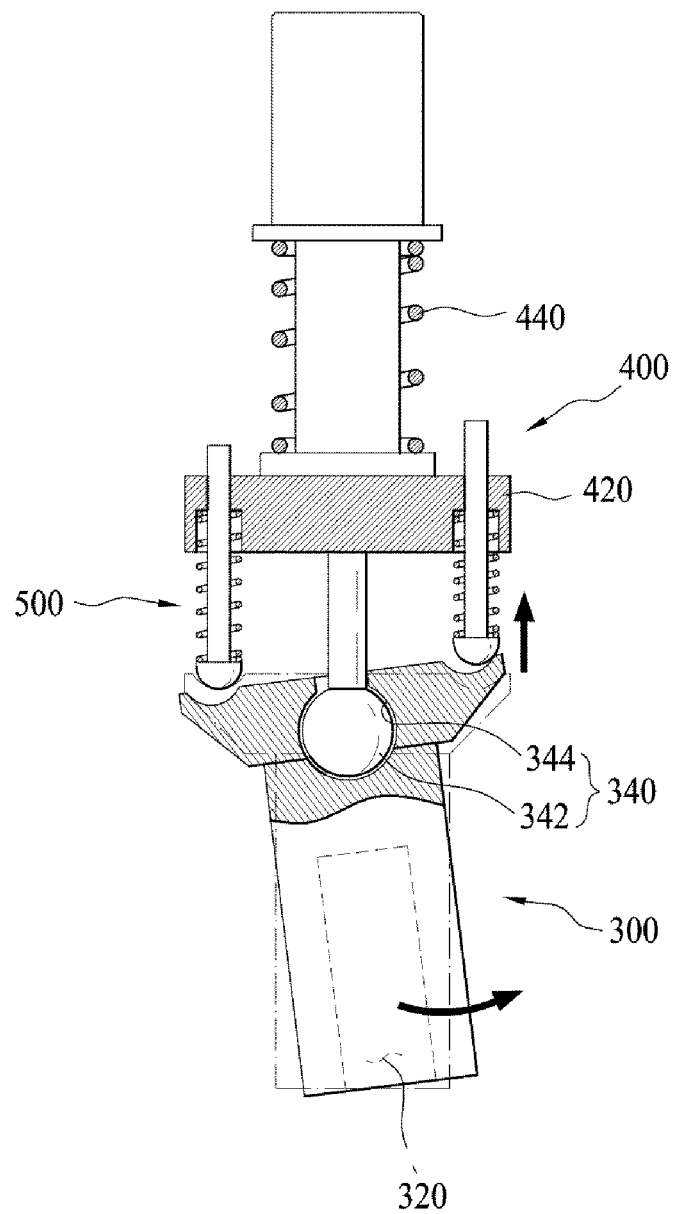

PROBE DEVICE OF FLOATING STRUCTURE

CROSS-REFERENCE TO RELATED APPLICATION

This application claims under 35 U.S.C. § 119(a) the benefit of Korean Patent Application No. 10-2019-0017522 filed on Feb. 15, 2019, the entire contents of which are incorporated herein by reference.

BACKGROUND

(a) Technical Field

The present invention relates to a probe device of a floating structure, and more particularly, to a probe device of a floating structure capable of compensating for an inclination at a predetermined angle in response to an external force applied thereto.

(b) Background Art

A semiconductor chip is manufactured through a process of forming a circuit pattern on a wafer and a process of assembling a module on the water with the circuit pattern by assembling each cell of each battery pack as a module, and a plurality of probe devices has been used between the manufacturing process and the assembling process to examine electric characteristics of each cell.

However, most conventional probe devices have a problem in that an overcurrent phenomenon occurs in a point contact portion when a current flows as the contact portion is point-contacted. This overcurrent phenomenon caused sparks to cause product defects.

As a solution for this problem, there is a surface-contact probe device in which the entire surface rather than the point contact is uniformly contacted. However, in the case of the surface-contact probe device, there is a problem that a terminal may be assembled to be inclined when assembling the terminal.

In addition, the surface-contact probe device has a problem in that when the external force is applied to a needle to be coupled to a pack terminal without a compensation for the bending degree depending on the external force, the needle may be bent according to a size and a direction of the external force and the bending of the needle has a bad effect on the terminal.

SUMMARY OF THE DISCLOSURE

The present invention has been derived to solve the above-described problems of the prior art, and an object of the present invention is to provide a probe device of a floating structure capable of compensating for an external force applied to a needle.

Another object of the present invention is to provide a probe device of a floating structure capable of providing a restoring force against an inclination when the external force is removed.

The objects of the present invention are not limited to the above-mentioned objects, and other objects not mentioned will be clearly understood by those skilled in the art from the following description.

An aspect of the present invention provides a probe device of a floating structure comprising a probe unit having a groove formed at one end thereof into which a needle for transmitting an electrical signal is inserted, and a guide portion formed at the other end thereof and a plate unit having an inner space which is inserted with the guide portion and formed to support a part of the guide portion, wherein the guide portion is spaced apart from the inner space at a predetermined interval by an external force applied to the needle.

The probe unit may include an elastic portion which is provided to transmit the external force applied to the needle to the guide portion or so that the guide portion contacts the inner space when the external force applied to the needle is removed.

The guide portion may be formed such that a part thereof becomes larger in width in a longitudinal direction.

Another aspect of the present invention provides a probe device of a floating structure comprising a probe unit having a groove formed at one end thereof into which a needle for transmitting an electrical signal is inserted, and a guide portion formed at the other end thereof, a plate unit installed at one end into which a part of the guide portion is inserted, and an elastic unit connecting the other end of the probe unit and one end of the plate unit and formed to be contracted and relaxed according to an external force applied to the needle.

The guide portion may include a guide member having one end formed in a spherical shape and an accommodation space formed to accommodate the guide member.

The elastic unit may be provided in plural and an axis of the probe unit may be inclined with respect to an axis of the guide portion according to the external force.

The plate unit may include a plate member installed to be inserted with the guide portion and a spring member providing a restoring force to the plate member when the external force is removed.

The probe device of the floating structure of the present invention for solving the above problems has the following effects.

First, it is possible to compensate for the inclination of the probe unit based on the plate unit in response to the external force.

Second, it is possible to restore the probe device to a state before the external force is applied by providing a restoring force when the external force is removed.

The effects of the present invention are not limited to the aforementioned effect, and other effects, which are not mentioned above, will be apparent to a person having ordinary skill in the art from the description of the claims.

BRIEF DESCRIPTION OF THE DRAWINGS

The above and other features of the present invention will now be described in detail with reference to certain embodiments thereof illustrated the accompanying drawings which are given hereinbelow by way of illustration only, and thus are not limitative of the present invention, and wherein:

FIGS. 1 to 4 illustrate a first embodiment of a probe device of a floating structure of the present invention; and FIGS. 5 to 7 illustrate a second embodiment of a probe device of a floating structure of the present invention.

DETAILED DESCRIPTION

Hereinafter, preferred embodiments of the present invention, in which a purpose of the present invention can be realized in detail, will be described with reference to the accompanying drawings. In describing the embodiment, the same name and the same reference numeral are used with respect to the same component and the resulting additional description will be omitted.

In addition, in the following description of the embodiments of the present invention, components having the same function just use the same names and the same reference numerals, and are not substantially identical to the prior art.

Terms used in the embodiments of the present invention are used only to describe specific exemplary embodiments, and are not intended to limit the present invention. A singular form may include a plural form if there is no clearly opposite meaning in the context.

In the embodiments of the present invention, it should be understood that the term "include" or "have" indicates that a feature, a number, a step, an operation, a component, a part, or the combination thereof described in the specification is present, but does not exclude a possibility of presence or addition of one or more other features, numbers, steps, operations, components, parts, or combinations thereof, in advance.

A first embodiment of a probe device of a floating structure of the present invention will be described with reference to FIGS. 1 to 4. FIGS. 1 to 4 illustrate a first embodiment of a probe device of a floating structure of the present invention.

According to the first embodiment, the probe device of the floating structure of the present invention may include a probe unit and a plate unit.

The probe unit may have a groove formed at one end thereof into which a needle for transmitting an electrical signal is inserted, and a guide portion formed at the other end thereof.

The needle may serve as a tip input to the terminal, and an area to be contacted or a contacting method may be various. The groove may be formed in response to the area or method in which the needle is contacted, and the needle may be coupled to the groove to transmit an electrical signal.

The guide portion may compensate for an inclined strain according to the external force applied to the probe unit.

The plate unit may include an inner space which is inserted with the guide portion and formed to support a part of the guide portion.

That is, at least a part of the guide portion may be located in the inner space of the plate unit. The plate unit may be a component coupled to a part of a pack terminal block or the pack terminal block as illustrated in FIG. 1 and may be formed in various ways.

With respect to a relationship between the guide portion and the plate unit, the guide portion may be spaced apart from the inner space at a predetermined interval by the external force applied to the needle.

Specifically, when the needle is not coupled to the groove, that is, the needle is removed from the groove, the guide portion may be provided so that a part thereof contacts a part of the inner space. Accordingly, the inner space is preferably formed to correspond to the shape of the guide portion. However, the shape of the inner space is not limited as long as the function above may be performed.

In addition, the guide portion may be spaced apart from the inner space at a predetermined interval by the external force applied while the needle is coupled to the groove.

At this time, the probe unit may further include an elastic portion.

The elastic portion may be provided to transmit the external force applied to the needle to the guide portion or so that the guide portion contacts the inner space when the external force applied to the needle is removed.

Specifically, when the needle is coupled to the groove by the external force, the elastic portion may transmit the external force to the guide portion so that the guide portion is spaced apart from the inner space at a predetermined interval.

In addition, when the needle is removed from the groove, the elastic portion may provide a restoring force to the guide portion so that a part of the guide portion is supported to contact a part of the inner space.

As the guide portion is spaced apart from the inner space by the elastic portion, the present invention may compensate for the inclination of an axis of the guide portion generated while the needle is coupled to the groove.

Specifically, as illustrated in FIG. 4, the axis of the probe unit in which the groove is formed is inclined with respect to the axis of the plate unit in a direction to which the external force is applied. At this time, the guide portion is spaced apart from the plate unit at a predetermined interval, and as a result, the guide portion is inclined until the spaced space is filled by the inclined guide portion and may correspond to the external force.

In order to realize the above effects, the guide portion may be formed such that a part thereof becomes larger in width in a longitudinal direction.

For example, it is preferable that the guide portion is formed in a conical shape having a trapezoidal cross section. However, the shape is just illustrative and is not limited thereto.

Hereinafter, a second embodiment of a probe device of a floating structure of the present invention will be described with reference to FIGS. 5 to 7. FIGS. 5 to 7 illustrate a second embodiment of a probe device of a floating structure of the present invention.

According to the second embodiment, the probe device of the floating structure of the present invention may include a probe unit, a plate unit, and an elastic unit.

The probe unit may have a groove formed at one end thereof into which a needle for transmitting an electrical signal is inserted, and a guide portion formed at the other end thereof.

The needle may serve as a tip input to the terminal, and an area to be contacted or a contacting method may be various. The groove may be formed in response to the area or method in which the needle is contacted, and the needle may be coupled to the groove to transmit an electrical signal.

The guide portion may include a guide member and an accommodation space.

It is preferable that one end of the guide member is formed in a spherical shape. However, the shape is not limited thereto.

The accommodation space may be formed to accommodate the guide member.

The accommodation space is preferably formed in response to the shape of the guide member. For example, according to FIGS. 5 to 7, the guide member is formed in a spherical shape, the accommodating space is formed to surround at least a part of the guide member, and the guide member may rotate freely in the accommodation space.

The plate unit may be installed at one end thereof into which a part of the guide portion is inserted.

That is, a part of the guide portion may be located in the plate unit. The plate unit may be a component coupled to a part of a pack terminal block or the pack terminal block and may be formed in various ways.

At this time, the plate unit may include a plate member and a spring member.

The plate member may be installed so that the guide portion is inserted.

A part of the guide portion may be fixed to the plate member to face the guide member located in the accommodation space. Accordingly, the guide portion may have a constant axis with respect to the plate unit even when an external force is applied.

The spring member may provide a restoring force to the plate member when the external force is removed.

That is, when the needle is removed from the groove, the spring member may provide a restoring force to the plate member so that the plate member is restored to a state before the needle is coupled to the groove.

The elastic unit may be formed to connect the other end of the probe unit and one end of the plate unit, and to be contracted and relaxed according to an external force applied to the needle.

For example, the elastic unit may be provided in plural, and the axis of the probe unit may be inclined with respect to the axis of the guide unit according to the external force.

As can be seen in FIGS. 6 and 7, when the needle is coupled to the groove, the elastic unit may be contracted and relaxed in a direction of the external force applied to the needle. Therefore, the present invention may compensate for the inclination of the axis of a part of the guide portion generated while the needle is coupled to the groove by interlocking with the elastic unit and the guide member.

Specifically, as illustrated in FIG. 6, even when the axis of a part of the guide portion is inclined to the left side with respect to the plate unit, the elastic unit at the left side is contracted and the elastic unit at the right side is relaxed and simultaneously, the guide member may rotate freely in the accommodation space, thereby compensating for the inclination.

Further, as illustrated in FIG. 7, even when the axis of a part of the guide portion is inclined to the right side with respect to the plate unit, the elastic unit at the left side is relaxed and the elastic unit at the right side is contracted and simultaneously, the guide member may rotate freely in the accommodation space, thereby compensating for the inclination.

As described above, the prepared embodiments of the present invention have been described and it will be apparent to those skilled in the art that the present invention can be materialized in other specific forms without departing from the gist or scope in addition to the above described embodiments. Therefore, the aforementioned embodiments are not limited but should be considered to be illustrative, and accordingly, the present invention is not limited to the above description and may be modified within the scope of the appended claims and an equivalent range thereto.

10: Pack terminal block
100: Probe unit
120: Groove
140: Guide portion
160: Elastic portion
200: Plate unit
220: Inner space
300: Probe unit
320: Groove
340: Guide portion
342: Guide member
344: Accommodation space
400: Plate unit
420: Plate member
440: Spring member
500: Elastic unit

What is claimed is:

1. A probe device of a floating structure comprising:
a probe unit having a groove formed at one end thereof into which a needle for transmitting an electrical signal is inserted, and a guide portion formed at the other end thereof;
a plate unit installed at one end into which a part of the guide portion is inserted; and
an elastic unit formed to connect the other end of the probe unit and one end of the plate unit and to be contracted and relaxed according to an external force applied to the needle,
wherein the guide portion includes
a single guide member having one end formed in a spherical shape and the other end formed in a cylindrical shape which is fixed to the plate unit; and
an accommodation space formed to accommodate the single guide member.

2. The probe device of the floating structure of claim 1, wherein the elastic unit is provided in plural and an axis of the probe unit is inclined with respect to an axis of the guide portion according to the external force.

3. The probe device of the floating structure of claim 1, wherein the plate unit includes
a plate member installed to be inserted with the guide portion; and
a spring member providing a restoring force to the plate member when the external force is removed.

* * * * *